United States Patent
Furukawa et al.

(10) Patent No.: US 6,875,685 B1
(45) Date of Patent: Apr. 5, 2005

(54) METHOD OF FORMING GAS DIELECTRIC WITH SUPPORT STRUCTURE

(75) Inventors: Toshiharu Furukawa, Essex Junction, VT (US); Mark C. Hakey, Fairfax, VT (US); David V. Horak, Essex Junction, VT (US); Charles W. Koburger, III, Delmar, NY (US); Peter H. Mitchell, Jericho, VT (US); Larry A. Nesbit, Williston, VT (US); James A. Slinkman, Montpelier, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/605,766

(22) Filed: Oct. 24, 2003

(51) Int. Cl.⁷ ......................................... H01L 21/4763
(52) U.S. Cl. ....................... 438/619; 438/624; 438/634; 438/639
(58) Field of Search ............................... 438/619, 623, 438/624, 631, 634, 637, 638, 639

(56) References Cited

U.S. PATENT DOCUMENTS

| | | |
|---|---|---|
| 3,890,636 A | 6/1975 | Harada et al. |
| 5,144,411 A | 9/1992 | Kaanta et al. |
| 5,148,260 A | 9/1992 | Inoue et al. |
| 5,413,962 A | 5/1995 | Lur et al. |
| 5,641,711 A | 6/1997 | Cho |
| 5,759,913 A | 6/1998 | Fulford, Jr. et al. |
| 6,111,199 A | 8/2000 | Wyland et al. |
| 6,171,971 B1 | 1/2001 | Natzle |
| 6,184,121 B1 | 2/2001 | Buchwalter et al. |
| 6,265,321 B1 | 7/2001 | Chooi et al. |
| 6,303,487 B1 | 10/2001 | Kagamihara |
| 6,307,265 B1 * | 10/2001 | Anand et al. ................ 257/758 |
| 6,429,522 B2 | 8/2002 | Petrarca et al. |
| 2001/0014526 A1 * | 8/2001 | Clevenger et al. .......... 438/619 |
| 2002/0047207 A1 | 4/2002 | Sekiguchi |
| 2003/0022481 A1 | 1/2003 | Nakagawa et al. |
| 2003/0073302 A1 | 4/2003 | Huibers |
| 2004/0063305 A1 * | 4/2004 | Kloster et al. .............. 438/619 |
| 2004/0099951 A1 * | 5/2004 | Park et al. ................... 257/758 |
| 2004/0102031 A1 * | 5/2004 | Kloster et al. .............. 438/619 |

* cited by examiner

*Primary Examiner*—Stephen W. Smoot
(74) *Attorney, Agent, or Firm*—Anthony J. Canale; Hoffman, Warnick & D'Alessandro LLC

(57) ABSTRACT

A method for forming a gas dielectric with support structure on a semiconductor device structure provides low capacitance and adequate support for a conductor of the semiconductor device structure. A conductive structure, such as via or interconnect, is formed in a wiring-layer dielectric. A support is then formed that connects to the conductive structure, the support including an area thereunder. The wiring-layer dielectric is then removed from the area to form a gas dielectric.

20 Claims, 6 Drawing Sheets

METHOD OF FORMING GAS DIELECTRIC WITH SUPPORT STRUCTURE

BACKGROUND OF INVENTION

1. Technical Field

The invention relates generally to semiconductor device structures and more specifically to a gas dielectric with support structure formed on a semiconductor device structure.

2. Related Art

In order to enhance chip operational speed, semiconductor devices have been continuously scaled down in size. Unfortunately, as semiconductor device size is decreased, the capacitive coupling between conductors in a circuit tends to increase since the capacitive coupling is inversely proportional to the distance between the conductors. This coupling may ultimately limit the speed of the chip or otherwise inhibit proper chip operation if steps are not taken to reduce the coupling.

The capacitance between conductors is also dependent on the insulator, or dielectric, used to separate the conductors. Traditional semiconductor fabrication commonly employs silicon dioxide as a dielectric, which has a dielectric constant of approximately 3.9. One challenge facing further development is finding materials with a lower dielectric constant that can be used between the conductors. As the dielectric constant of such materials is decreased, the speed of performance of the chip is increased. Some materials that have been used to provide a lower dielectric constant between conductors include fluorinated glass, organic materials and organic materials containing gas, such as air. Unfortunately, organic materials suffer from temperature limitations, shrinkage or swelling during manufacturing or chip operation, and poor structural integrity. Application of simple gas dielectric structures tends to create sagging of long line conductors as well as producing poor structural integrity.

Accordingly, a need has developed in the art for a method of forming a dielectric structure on a semiconductor device structure that will provide low capacitance but adequate support for the conductors.

SUMMARY OF INVENTION

The present invention provides a method for forming a gas dielectric structure on a semiconductor device structure that will provide low capacitance and adequate support for the conductors.

Generally, a first aspect of the present invention is directed to a method of forming a gas dielectric with support structure comprising the steps of: providing a conductive structure in a wiring-layer dielectric; forming a support connected to the conductive structure, the support including an area thereunder; and removing the wiring-layer dielectric from the area to form a gas dielectric.

In addition, a second aspect of the present invention provides a semiconductor device structure comprising: a semiconductor substrate; a conductive structure; a support connected to and coplanar to a top surface of the conductive structure, the support including an area thereunder; and a gas dielectric in the area and surrounding a portion of the conductive structure.

The present invention also provides a method of forming a gas dielectric with support structure comprising the steps of: providing an underlying structure; forming a via layer dielectric on the underlying structure, forming a wiring-layer dielectric on the via-layer dielectric; forming a conductive structure in the wiring-layer dielectric; forming a support connected to and coplanar to a top surface of the conductive structure, the support including an area thereunder; and removing the wiring-layer dielectric from the area to form a gas dielectric.

The foregoing and other features of the invention will be apparent from the following more particular description of embodiments of the invention, as illustrated in the accompanying drawings.

BRIEF DESCRIPTION OF DRAWINGS

Embodiments of the present invention will hereinafter be described in conjunction with the appended drawings, where like designations denote like elements, and wherein.

DETAILED DESCRIPTION

Figure 1:
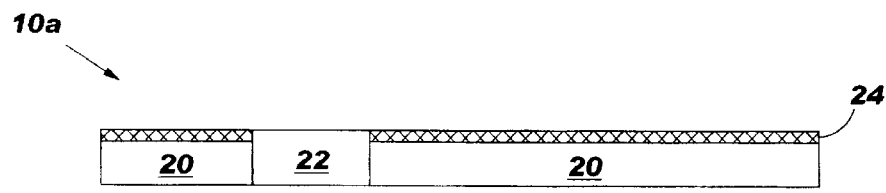
FIGS. 1, 2, 3, 4, 5, 6, 7, 8, 9, 10 and 11 are cross-sectional views of a semiconductor wafer illustrating a set of steps that may be used to form a gas dielectric with support structure in accordance with a first embodiment of the present invention.

FIGS. 1–11 illustrate a set of steps for forming a gas dielectric with support structure (elements 30, 40 and 54 in FIG. 11) on an underlying structure 20 in accordance with a first embodiment of the present invention. As shown in FIG. 1, the first step 10a includes providing underlying structure 20, and an interlayer 24 on top of underlying structure 20. Underlying structure 20 may be a semiconductor substrate. Underlying structure 20 may also be a single layer of material, or may consist of a multitude of layers, including metal, dielectric, and/or semiconductor layers, that may be patterned and formed in a previous level in the semiconductor manufacturing process. Underlying structure 20 may also contain at least one contact 22, which may be a conductor from another semiconductor level. Interlayer 24 provides a barrier layer for underlying structure 20. Contact 22 may be formed from any conductive material, such as copper or aluminum, or a combination of such.

Figure 2:
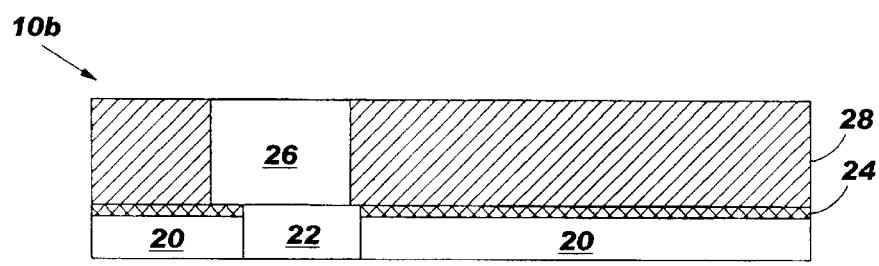

The next step 10b is shown in FIG. 2, wherein a via-layer dielectric 28 is formed on interlayer 24 and a via 26 is formed through via-layer dielectric 28. Via 26 may be formed from any conductive material, such as copper or aluminum, or a combination of such. Via-layer dielectric 28 may include a dielectric material such as a silicon-dioxide based or organic based material, but is not limited to such.

Figure 3:
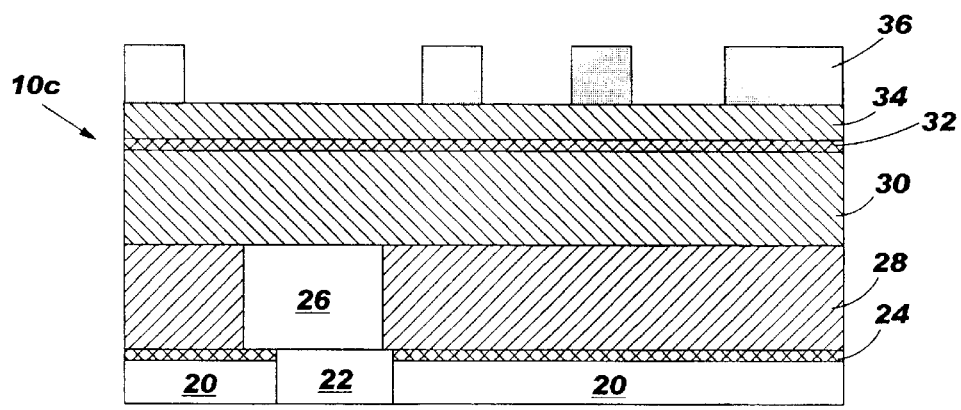

FIG. 3 illustrates step 10c, wherein a wiring-layer dielectric 30 is formed on via-layer dielectric 28. A stopping layer 32 is formed on wiring-layer dielectric 30, and a sacrificial layer 34 is formed on stopping layer 32. A resist pattern 36 is then formed on sacrificial layer 34 in a predetermined pattern. Wiring-layer dielectric 30 is of a different dielectric material than via-layer dielectric 28 in accordance with the first embodiment of the present invention. Thus, as an example, wiring-layer dielectric 30 may be a germanium oxide material, and via-layer dielectric 28 may be a silicon dioxide, but they are not limited to such. The different dielectric materials allow for selective etching. Wiring-layer dielectric 30 and sacrificial layer 34 may both be of the same material, but are not limited to such. Sacrificial layer 34 may also be of another material that is not dielectric. Stopping layer 32 is of a different material than sacrificial layer 34, wiring-layer dielectric 30, and via-layer dielectric 28 for this specific embodiment. Silicon nitride is an example of a dielectric material that may be used for stopping layer 32, but other dielectric materials may also be used. The removal of sacrificial layer 34 to the top of stopping layer 32 allows for an even and uniformly thick interconnect through and between semiconductor layers, which will be discussed in greater detail in reference to FIGS. 5 and 6.

Figure 4:
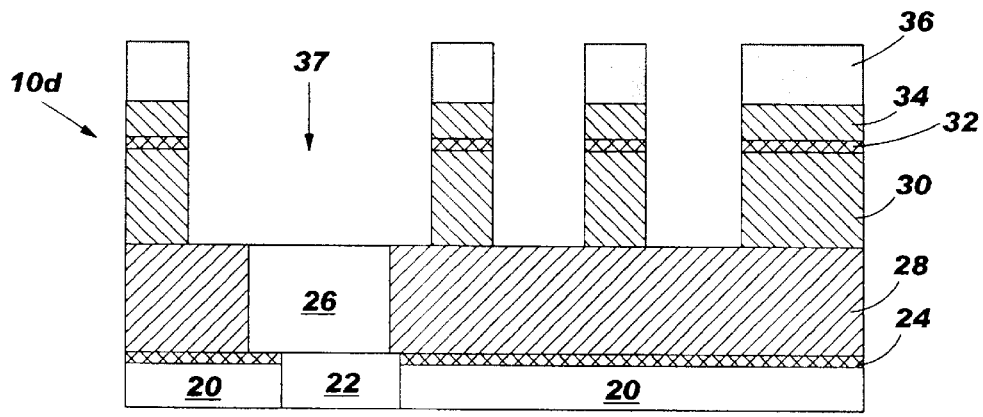

Step 10d, as shown in FIG. 4, includes etching 37 of wiring-layer dielectric 30, stopping layer 32 and sacrificial layer 34 where there are openings in resist pattern 36. Etching stops at via-layer dielectric 28 and via 26.

Figure 5:
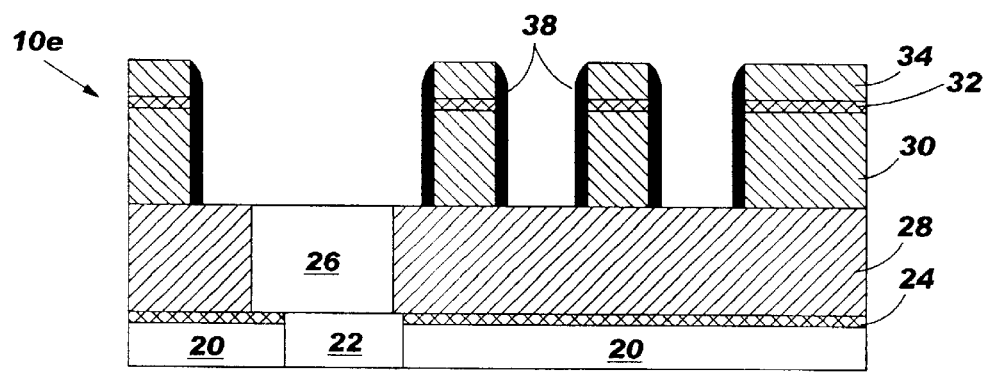

In step 10e, as shown in FIG. 5, resist pattern 36 (FIG. 4) is removed. Sacrificial spacers 38 are formed on the sides of wiring-layer dielectric 30, stopping layer 32 and sacrificial layer 34 through vertical etching. The vertical etching of sacrificial spacers 38 typically forms a decreasing thickness toward the top of the resulting structure.

Figure 6:
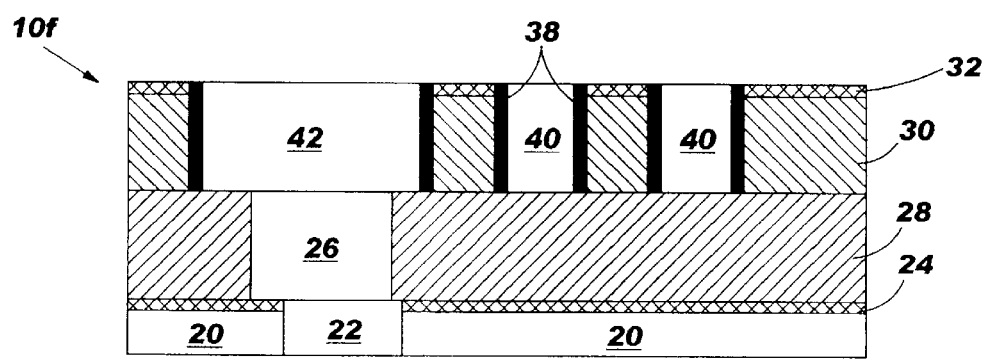

Step 10f, as shown in FIG. 6, includes forming several conductive structures, such as interconnects 40 and conductor 42, between sacrificial spacers 38. First, conductive material is added between several of sacrificial spacers 38. Then, the conductive material is partially removed substantially coplanar to a top surface of the sacrificial layer, and then polished down with sacrificial layer 34 (FIG. 5) and a portion of sacrificial spacers 38 to stopping layer 32, forming interconnects 40 and conductor 42. Conductor 42 may be any conductor, such as an interconnect, landing pad or wire. Sacrificial layer 34 (FIG. 5) and a portion of sacrificial spacers 38 may be removed through a single polish, or several sequential polishes, or similar methods. As aforementioned, the removal of sacrificial layer 34 (FIG. 5) to the top of stopping layer 32 allows for even and uniformly thick interconnects 40 and conductor 42 through and between semiconductor layers since the variable thickness of sacrificial spacers 38 toward the top is removed along with sacrificial layer 34 (FIG. 5). Interconnects 40 and conductor 42 may be formed from any conductive material, such as copper or aluminum, or a combination of such. Interconnects 40 may be narrowly spaced conductors to allow for a decrease in the size of the semiconductor device structure that includes interconnects 40.

Figure 7:
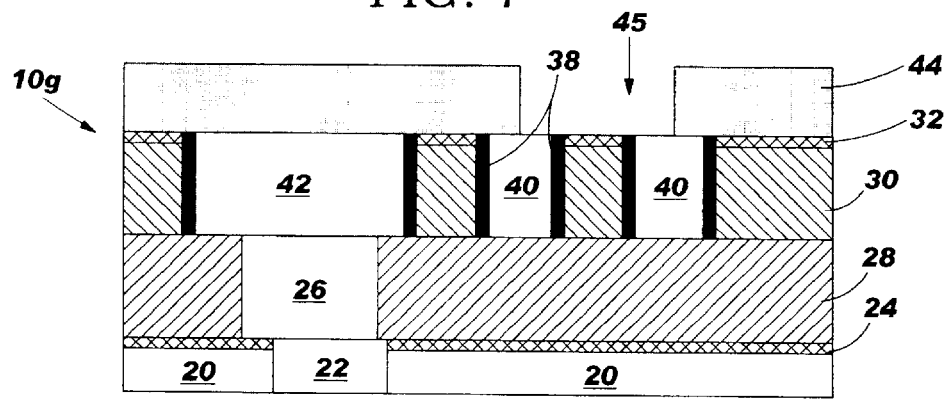

As shown in FIG. 7, step 10g includes forming a second resist pattern 44 having a resist opening 45 on stopping layer 32, sacrificial spacers 38, interconnects 40 and conductor 42. Second resist pattern 44 may be a lithographic layer, but is not limited to such.

Figure 8:
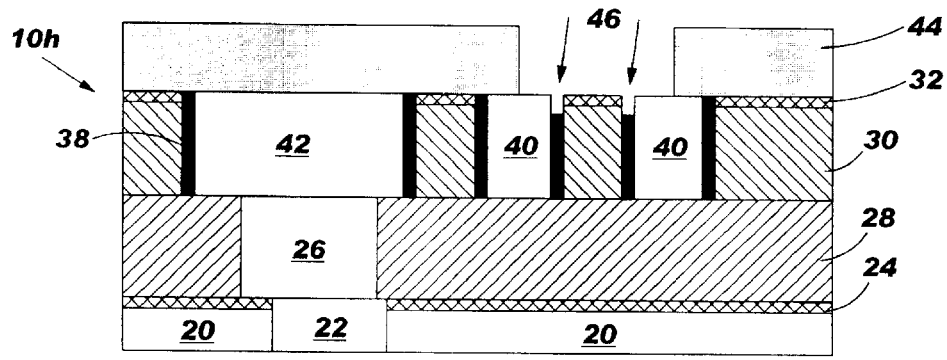

FIG. 8 illustrates, in step 10h, partial etching 46 into sacrificial spacers 38 where second resist pattern 44 provided resist opening, 45 (FIG. 7).

Figure 9:
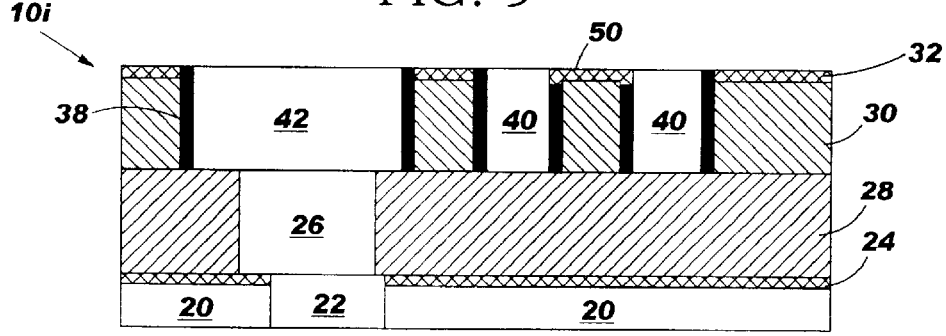

As seen in step 10i in FIG. 9, a dielectric material is added into the etched-out sections of sacrificial spacers 38, forming a dielectric bridge 50 across portions of wiring-layer dielectric 30 and sacrificial spacers 38, physically connecting at least two interconnects 40, or interconnects 40 and conductor 42. Dielectric bridge 50 may be formed by chemical-vapor deposition (CVD) followed by a polish, such as a chemical-mechanical polish, stopping on the surface of stopping layer 32. Thus, dielectric bridge 50 is formed coplanar to the top surface of stopping layer 32. Dielectric bridge 50 may be of the same dielectric material as stopping layer 32, but is not limited to such.

Figure 10:
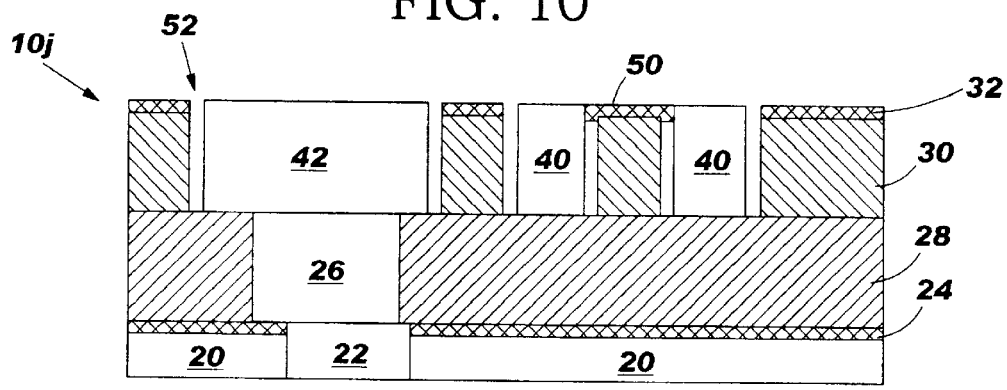

The next step 10j is shown in FIG. 10, wherein sacrificial spacers 38 are removed 52 through a selective isotropic etch, or similar method. Complete removal of sacrificial spacers 38 under dielectric bridge 50 is optional. If isotropic etch selectivity to surrounding materials is sufficient, the etch may be extended to allow complete removal of sacrificial spacers 38 under dielectric bridge 50, thereby further reducing interconnect-to-interconnect capacitance.

Figure 11:
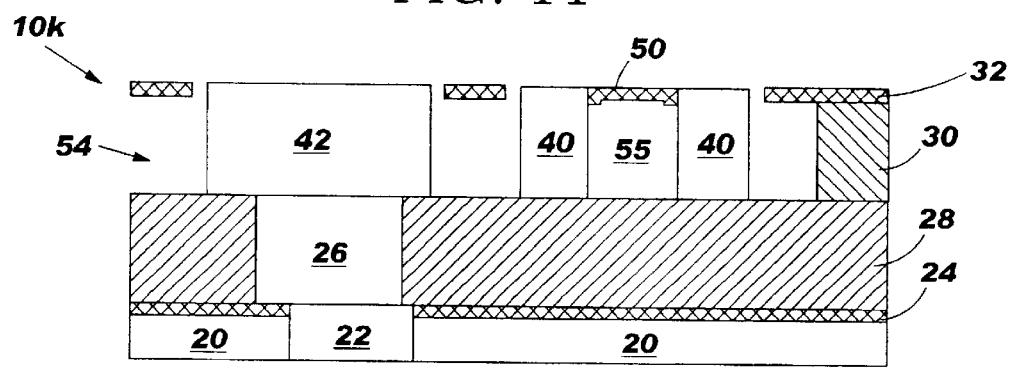

The next step 10k is shown in FIG. 11, wherein wiring-layer dielectric 30 is selectively removed, forming a gas dielectric 54 including an area or gap 55, under dielectric bridge 50. Gas dielectric 54 may contain air, or any other type of gas or combination of gases, or similar material. Gas dielectric 54 may be used between all intra-level conductor-to-conductor structures, reducing the capacitance therein. Dielectric bridge 50 provides support between at least two interconnects 40 and reduces long line sag as well as increases structural integrity, especially for subsequent layers of conductors. Dielectric bridge 50 is coplanar to stopping layer 32, thus providing a self-aligning feature for the semiconductor device structure. If two interconnects 40 are not supported, or do not support the rest of the structure, because of the distance between them, a portion of wiring-layer dielectric 30 may remain to provide extra support. However, gaps, such as gap 55, are always self-aligned next to the conducting layer, allowing maximum effect of the decrease in capacitance between conductors. The first embodiment of the present invention included the gas dielectric formed in steps 10a (FIG. 1) through 10k. As will be seen below, the next embodiments of the present invention include variations of FIG. 11, wherein there is less support, but lower capacitance of the semiconductor device structure. Thus, optimum support and capacitance may be achieved for each semiconductor device structure and its functions.

Figure 12:
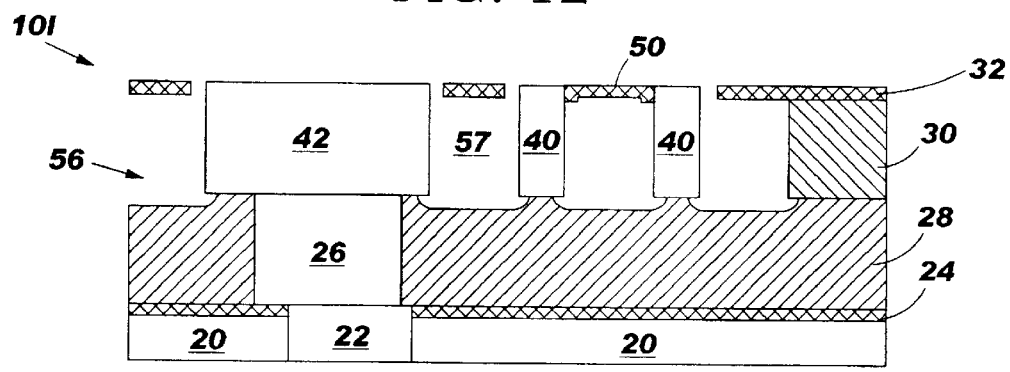
FIG. 12 is a cross-sectional view of a semiconductor wafer illustrating a step after the step in FIG. 11 to form a gas dielectric with support structure in accordance with a second embodiment of the present invention.

FIG. 12 illustrates, in the next step 10l, a second embodiment of the present invention. In FIG. 12, via-layer dielectric 28 is isotropically etched, creating gas dielectric 57. Gas dielectric 57 surrounds a portion of a bottom 56 of conductor 42 and interconnects 40. Thus, the gas dielectric structure of FIG. 12 provides more gas dielectric and slightly lower capacitance, but less support than the gas dielectric structure of FIG. 11. Optimum, and/or desired, support and capacitance may be achieved through the amount of etching done in via-layer dielectric 28.

Figure 13:
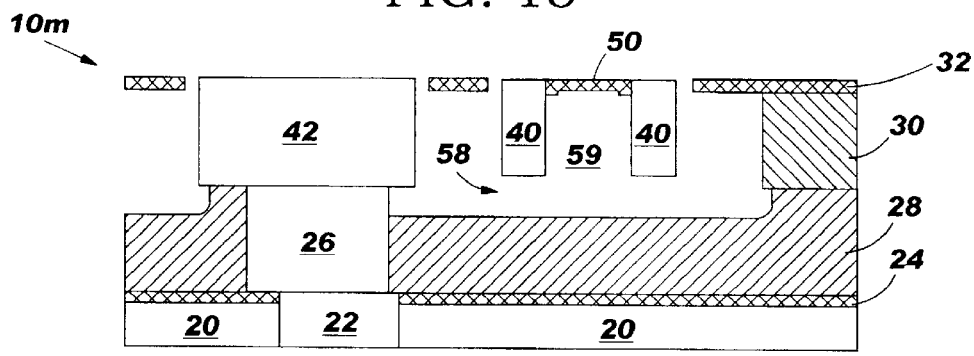
FIG. 13 is a cross-sectional view of a semiconductor wafer illustrating a step after the step of FIG. 12 to form a gas dielectric with support structure in accordance with a third embodiment of the present invention.

FIG. 13 illustrates, in step 10m, a third embodiment of the present invention, wherein more of via-layer dielectric 28 is etched compared to FIG. 12, creating gas dielectric 59. Gas dielectric 59 surrounds a portion of the bottom 56 of conductor 42 and surrounds the bottom 58 of interconnects 40. Although not shown, interconnects 40 may be widened at sections over a short distance and a portion of via-layer dielectric 28 may remain to provide extra support. As shown, support may still be provided for conductor 42, and spaces between interconnects 40 (through dielectric bridge 50). Through the etching, FIG. 13 provides more gas dielectric compared to that of FIG. 12, which in turn creates lower capacitance but less support compared to that of either FIG. 11 or FIG. 12. In this embodiment, gas dielectric 58 surrounds the sides and the bottom of interconnects 40. For both the second and third embodiment, via-layer dielectric 28 may include a material that has preferential layer etching along a direction, such as aligned crystals or nonhomogeneous unidirectional materials, but the invention is not limited to such.

Figure 14:
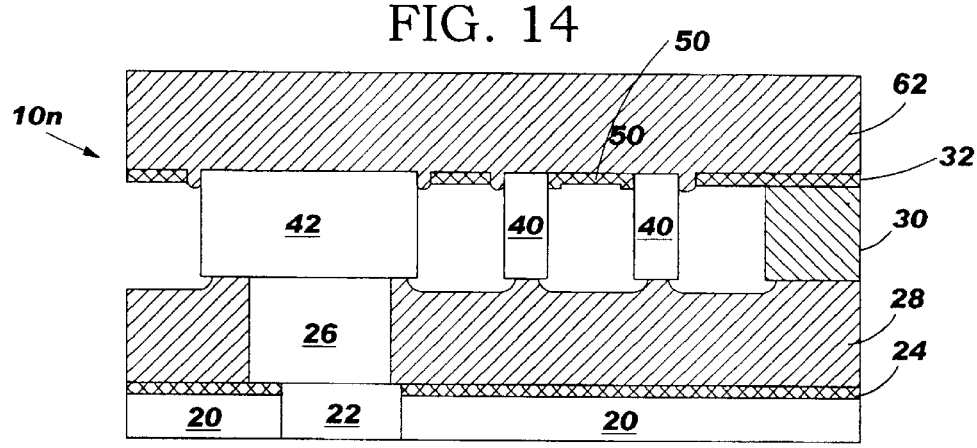
FIGS. 14 and 15 are cross-sectional views of a semiconductor wafer illustrating a set of steps that may be used with the steps of FIG. 11, 12 or 13 to form a second level semiconductor device structure in accordance with the present invention.
Figure 15:
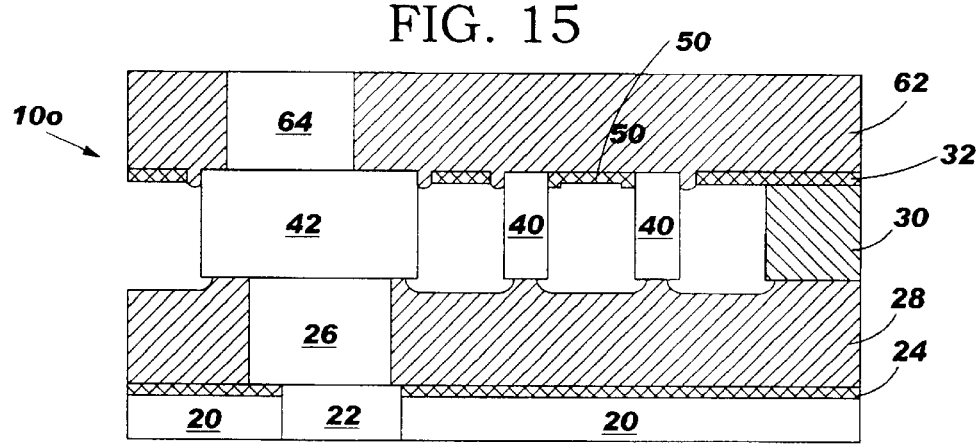

FIGS. 14 and 15 illustrate a set of steps 10$n$ and 10$o$ that may be used to form a second level including second-level via-layer dielectric 62 and via 64 (FIG. 15), and/or a second level gas dielectric structure (not shown), in accordance with the present invention. Although not shown, the process as described above may be repeated with second-level via-layer dielectric 62 and via 64 (FIG. 15) to form a second level gas dielectric structure. Furthermore, it is to be understood that more layers may be added to form other levels, which may or may not include gas dielectric structures. Accordingly, the invention is not limited by a single or double level.

In step 10$n$, as shown in FIG. 14, a second-level via-layer dielectric 62 is formed upon stopping layer 32, conductor 42, and interconnects 40. In this specific example, second-level via-layer dielectric 62 is formed after step 10$l$ (FIG. 12), but it is to be understood that second-level via layer dielectric 62 may also be formed after step 10$k$ (FIG. 11), or 10$m$ (FIG. 13), or any other similar step. Second-level via-layer dielectric 62 may be formed of the same material as dielectric material, but is not limited to such. The deposition of layer 62 is designed to have poor conformality, so minimal material is deposited in gas dielectric 54, and the openings 52 (FIG. 10) are closed in the early part of the deposition. The openings 52 (FIG. 10), therefore, have negligent impact on overall interconnect-to-interconnect capacitance.

The next step, step 10$o$, as shown in FIG. 15, includes providing a via 64 through second-level via-layer dielectric 62. In this specific embodiment, via 64 is fully landed on conductor 42. If via 64 does not contact fully with conductor 42, a separate method may be utilized, which will be discussed in reference to FIGS. 16, 17 and 18. Via 64 may be formed from any conductive material, such as copper or aluminum, or a combination of such.

Figure 16:
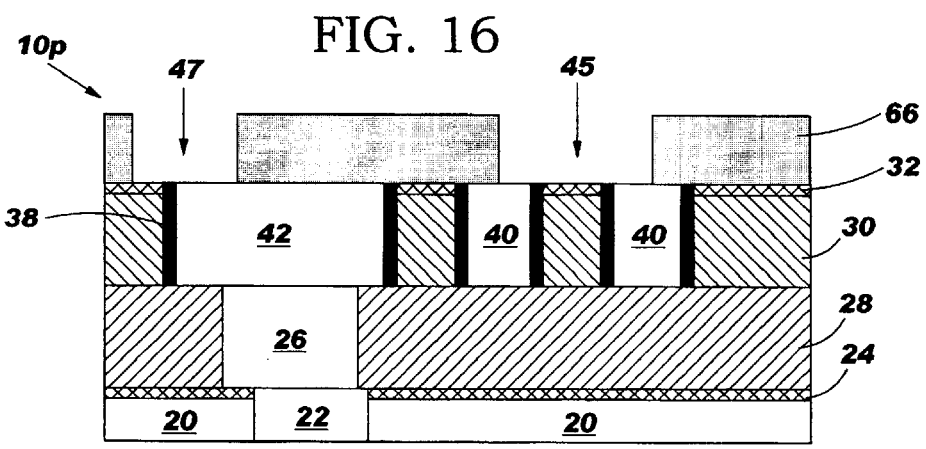
FIGS. 16 and 17 are cross-sectional views of a semiconductor wafer illustrating a set of steps after the step in FIG. 10 to form a gas dielectric with support structure in accordance with a fourth embodiment of the present invention.
Figure 17:
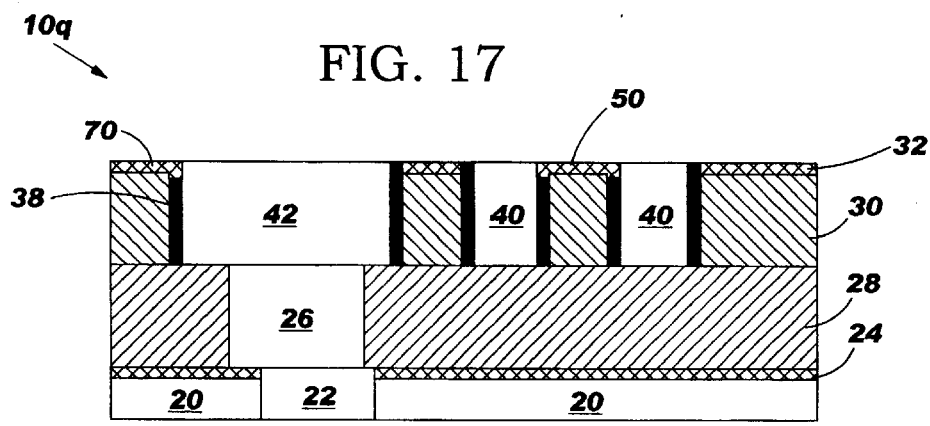
Figure 18:
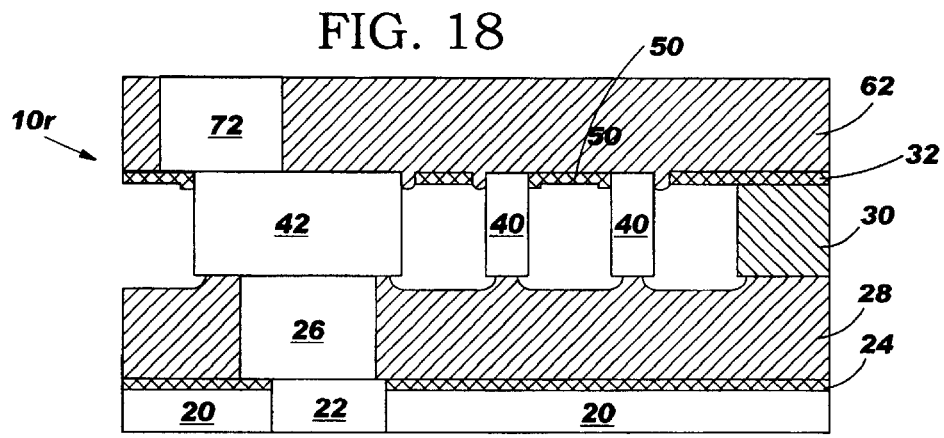
FIG. 18 is a cross-sectional view of a semiconductor wafer illustrating a set of steps that may be used with the steps of FIGS. 16 and 17 to form a second level semiconductor device structure in accordance with the fourth embodiment of the present invention.

FIGS. 16, 17, and 18 illustrate, through steps 10$p$, 10$q$ and 10$r$, a method to form a dielectric support 70, after the step in FIG. 10, for supporting a partial landed via, or a via 72 (FIG. 18) that does not fully contact conductor 42 in accordance with the fourth embodiment of the present invention. Dielectric support 70, which is coplanar to the top surface of conductor 42, seals off any access slots (e.g., openings 52 in FIG. 10) and allows self-alignment of the next semiconductor layer.

As shown in FIG. 16, step 10$p$ includes forming an additional resist opening 47 in resist pattern 44 on stopping layer 32, sacrificial spacers 38, interconnects 40 and conductor 42. Resist opening 47 allows a support to be formed around an unlanded via (not shown), allowing a continuous etch stop for the via etch.

FIG. 17, in step 10$q$, illustrates forming dielectric bridge 50 and dielectric support 70 where resist pattern 44 provided resist opening 45 (FIG. 16) and resist opening 47 (FIG. 16). Dielectric bridge 50 and dielectric support 70 are formed by adding a dielectric material into etched-out sections of sacrificial spacers 38, as described above. Dielectric support 70 is formed coplanar to stopping layer 32, and physically connects to conductor 42. Dielectric support 70 may be of the same dielectric material as stopping layer 32, but is not limited to such.

As shown in FIG. 18, step 10$r$ includes adding a second-level, including second-level via-layer dielectric 62 and via 72, on stopping layer 32, interconnects 40, conductor 42, dielectric bridge 50 and dielectric support 70. Although, as shown, gas dielectric structure (including interconnects 40 and dielectric bridge 50) may be formed as the gas dielectric structure shown in FIG. 12, other embodiments of gas dielectric structure as previously discussed may also be used. As aforementioned, via 72 is a partial landed via, but is supported by dielectric support 70.

The present invention provides a plurality of methods for forming a gas dielectric structure on a semiconductor device structure that will provide low capacitance and adequate support for the interconnects of the semiconductor device structure.

While the invention has been particularly shown and described with reference to specific embodiments thereof, it will be understood by those skilled in the art that the foregoing and other changes in form and details may be made therein without departing from the spirit and scope of the invention.

What is claimed is:

1. A method of forming a gas dielectric with support structure comprising the steps of:
    providing a conductive structure in a wiring-layer dielectric, the conductive structure being separated from the wiring-layer dielectric by a vertical structure;
    forming a support connected to the conductive structure, the support including an area thereunder; and
    removing the wiring-layer dielectric and the vertical structure from the area to form a gas dielectric.

2. The method of claim 1, further comprising the steps of:
    providing the conductive structure as a first interconnect; and
    providing a second interconnect in spaced relation away from the first interconnect in the wiring-layer dielectric, wherein the support forms a bridge connecting the first interconnect with the second interconnect.

3. The method of claim 2, wherein the bridge is formed coplanar with a top surface of the first interconnect and the second interconnect.

4. The method of claim 2, further comprising the steps of
    providing a via-layer dielectric layer;
    providing the wiring-layer dielectric on the via-layer dielectric; and
    removing a portion of the via-layer dielectric, wherein the gas dielectric surrounds the bottom of the first interconnect and the second interconnect.

5. The method of claim 1, wherein the support is formed coplanar with a top surface of the conductive structure.

6. The method of claim 1, wherein the support includes a dielectric material.

7. The method of claim 1, further comprising the steps of:
    providing a via-layer dielectric;
    providing the wiring-layer dielectric on the via-layer dielectric; and removing a portion of the wiring-layer dielectric, wherein the gas dielectric surrounds a portion of a bottom of the conductive structure.

8. The method of claim 1, wherein forming the support further comprises the steps of:

forming a stopping layer on the wiring layer dielectric;

forming a sacrificial layer on the stopping layer;

selectively removing a portion of the sacrificial layer, the stopping layer, and the wiring-layer dielectric for placement of the conductive structure;

forming the vertical structure as a vertical sacrificial spacer in the portion selectively removed to surround a portion of the conductive structure;

forming the conductive structure between the vertical sacrificial spacer, partially removing the conductive structure substantially coplanar to a top surface of the sacrificial layer;

removing the sacrificial layer and a top portion of the vertical sacrificial spacer; and forming a support with the stopping layer and a material on the vertical sacrificial spacer, wherein the material is formed coplanar to a top surface of the stopping layer and connects to the conductive structure.

9. The method of claim 1, wherein the conductive structure includes a wire.

10. A method of forming a gas dielectric with support structure comprising the steps of:

providing an underlying structure;

forming a via-layer dielectric on the underlying structure;

forming a wiring-layer dielectric on the via-layer dielectric;

forming a conductive structure in the wiring-layer dielectric, the conductive structure being separated from the wiring-layer dielectric by a vertical structure;

forming a support connected to and coplanar to a top surface of the conductive structure, the support including an area thereunder; and removing the wiring-layer dielectric and the vertical structure from the area to form a gas dielectric.

11. The method of claim 10, further comprising the steps of:

providing the conductive structure as a first interconnect; and providing a second interconnect in spaced relation away from the first interconnect in the wiring-layer dielectric, wherein the support forms a bridge connecting the first interconnect with the second interconnect.

12. The method of claim 11, wherein the bridge is formed coplanar with a top surface of the first interconnect and the second interconnect.

13. The method of claim 11, further comprising the step of removing a portion of the via-layer dielectric, wherein the gas dielectric surrounds the bottom of the first interconnect and the second interconnect.

14. The method of claim 10, wherein the conductive structure includes a wire.

15. The method of claim 10, wherein the support includes a dielectric material.

16. The method of claim 10, further comprising the step of removing a portion of the via-layer dielectric, wherein the gas dielectric surrounds a portion of a bottom of the conductive structure.

17. The method of claim 10, further comprising the step of removing a portion of the wiring-layer dielectric, wherein the gas dielectric surrounds a portion of a bottom of the conductive structure.

18. The method of claim 10, wherein forming the support further comprises the steps of:

forming a stopping layer on the wiring-layer dielectric;

forming a sacrificial layer on the stopping layer; and selectively removing a portion of the sacrificial layer, the stopping layer, and the wiring-layer dielectric for placement of the conductive structure.

19. The method of claim 18, further comprising the steps of:

forming the vertical structure as a vertical sacrificial spacer in the portion selectively removed to surround a portion of the conductive structure;

forming the conductive structure between the vertical sacrificial spacer;

partially removing the conductive structure substantially coplanar to a top surface of the sacrificial layer;

removing the sacrificial layer and a top portion of the vertical sacrificial spacer; and forming a support with the stopping layer and a material on the vertical sacrificial spacer, wherein the material is formed coplanar to a top surface of the stopping layer and connects to the conductive structure.

20. A method of forming a gas dielectric with support structure comprising the steps of:

providing a conductive structure in a wiring-layer dielectric;

forming a support connected to the conductive structure, the support including an area thereunder; and removing the wiring-layer dielectric form the area to form a gas dielectric;

wherein forming the support further compromises the steps of:

forming a stopping layer on the wiring-layer dielectric;

forming a sacrificial layer on the stopping layer;

selectively removing a portion of the sacrificial layer, the stopping layer, and the wiring-layer dielectric for placement of the conductive structure;

forming a vertical sacrificial spacer in the portion selectively removed to surround a portion of the conductive structure;

forming the conductive structure between the vertical sacrificial spacer;

partially removing the conductive structure;

removing the sacrificial layer and a top portion of the vertical sacrificial spacer; and forming a support with the stopping layer and a material on the vertical sacrificial spacer, wherein the material is formed coplanar to a top surface of the stopping layer and connects to the conductive structure.

* * * * *